(12) United States Patent
Seddon

(10) Patent No.: US 12,148,665 B2
(45) Date of Patent: *Nov. 19, 2024

(54) JET ABLATION DIE SINGULATION SYSTEMS AND RELATED METHODS

(71) Applicant: SEMICONDUCTOR COMPONENTS INDUSTRIES, LLC, Scottsdale, AZ (US)

(72) Inventor: Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/363,247

(22) Filed: Aug. 1, 2023

(65) Prior Publication Data
US 2023/0411214 A1    Dec. 21, 2023

Related U.S. Application Data

(63) Continuation of application No. 17/320,582, filed on May 14, 2021, now Pat. No. 11,756,830, which is a continuation of application No. 16/807,438, filed on Mar. 3, 2020, now Pat. No. 11,043,422, which is a continuation of application No. 16/136,026, filed on Sep. 19, 2018, now Pat. No. 10,607,889.

(51) Int. Cl.
| | |
|---|---|
| *H01L 21/78* | (2006.01) |
| *H01L 21/304* | (2006.01) |
| *H01L 21/3065* | (2006.01) |
| *H01L 21/56* | (2006.01) |
| *H01L 23/31* | (2006.01) |

(52) U.S. Cl.
CPC ......... *H01L 21/78* (2013.01); *H01L 21/3046* (2013.01); *H01L 21/3065* (2013.01); *H01L 21/561* (2013.01); *H01L 23/3171* (2013.01)

(58) Field of Classification Search
CPC . H01L 21/78; H01L 21/3065; H01L 21/3046; H01L 23/3171; H01L 21/561; H01L 2221/68368; H01L 2221/6834; H01L 2221/68327; H01L 21/6836
USPC ........................................... 438/460
See application file for complete search history.

(56) References Cited

U.S. PATENT DOCUMENTS

| | | | |
|---|---|---|---|
| 5,919,713 A | 7/1999 | Ishii et al. | |
| 7,060,531 B2 * | 6/2006 | Arita | H01L 21/78 438/464 |
| 7,192,878 B2 * | 3/2007 | Weng | H01L 21/76811 438/711 |
| 8,158,494 B2 * | 4/2012 | Haji | H01L 21/0273 438/460 |

(Continued)

*Primary Examiner* — Vu A Vu
(74) *Attorney, Agent, or Firm* — Adam R. Stephenson, LTD.

(57) ABSTRACT

Implementations of a method singulating a plurality of semiconductor die. Implementations may include: forming a pattern in a back metal layer coupled on a first side of a semiconductor substrate where the semiconductor substrate includes a plurality of semiconductor die. The method may include etching substantially through a thickness of the semiconductor substrate at the pattern in the back metal layer and jet ablating a layer of passivation material coupled to a second side of the semiconductor substrate to singulate the plurality of semiconductor die.

20 Claims, 3 Drawing Sheets

(56) References Cited

U.S. PATENT DOCUMENTS

| | | | | |
|---|---|---|---|---|
| 8,507,363 B2* | 8/2013 | Lei | ............... | H01L 21/67069 |
| | | | | 438/460 |
| 8,628,677 B2* | 1/2014 | De Brabander | .... | B81C 1/00103 |
| | | | | 216/72 |
| 8,802,545 B2* | 8/2014 | Johnson | ............... | H01L 21/68 |
| | | | | 438/464 |
| 8,859,396 B2* | 10/2014 | Grivna | ............... | H01L 21/78 |
| | | | | 257/E21.267 |
| 9,029,242 B2* | 5/2015 | Holden | ............... | H01L 21/78 |
| | | | | 438/462 |
| 9,165,895 B2* | 10/2015 | Brunner | ............... | H01L 21/78 |
| 9,219,011 B2* | 12/2015 | Engelhardt | ............... | B28D 5/00 |
| 9,337,098 B1* | 5/2016 | Seddon | ............... | H01L 21/67132 |
| 9,472,458 B2* | 10/2016 | Doub | ............... | H01L 21/02334 |
| 9,564,409 B2 | 2/2017 | Seddon et al. | | |
| 10,607,889 B1 | 3/2020 | Seddon | | |
| 10,916,474 B2 | 2/2021 | Grivna | | |
| 11,043,422 B2 | 6/2021 | Seddon | | |
| 11,688,638 B2* | 6/2023 | Chan | ............... | H01L 21/78 |
| | | | | 257/618 |
| 11,756,830 B2* | 9/2023 | Seddon | ............... | H01L 23/3171 |
| | | | | 438/460 |
| 2003/0189212 A1 | 10/2003 | Yoo | | |
| 2015/0091124 A1 | 4/2015 | Liu et al. | | |
| 2015/0371878 A1 | 12/2015 | Martinez et al. | | |

\* cited by examiner

JET ABLATION DIE SINGULATION SYSTEMS AND RELATED METHODS

CROSS REFERENCE TO RELATED APPLICATIONS

This application is a continuation application of the earlier U.S. Utility Patent Application to Michael Seddon entitled "Jet Ablation Die Singulation Systems and Related Methods," application Ser. No. 17/320,582, filed May 14, 2021, now pending, which application is a continuation application of the earlier U.S. Utility Patent Application to Michael Seddon entitled "Jet Ablation Die Singulation Systems and Related Methods," application Ser. No. 16/807,438, filed Mar. 3, 2020, now issued as U.S. Pat. No. 11,043,422, which application is a continuation application of the earlier U.S. Utility Patent Application to Michael Seddon entitled "Jet Ablation Die Singulation Systems and Related Methods," application Ser. No. 16/136,026, filed Sep. 19, 2018, issued as U.S. Pat. No. 10,607,889 on Mar. 31, 2020, the disclosures of each of which are hereby incorporated entirely herein by reference.

BACKGROUND

1. Technical Field

Aspects of this document relate generally to systems and methods used for singulating substrates. More specific implementations involve semiconductor substrates.

2. Background

Semiconductor substrates are used to form a wide variety of semiconductor devices. The semiconductor devices are generally distributed across a planar surface of the semiconductor substrate in a plurality of die. The plurality of die are separated from one another using a singulation process like sawing.

SUMMARY

Implementations of a method singulating a plurality of semiconductor die may include: forming a pattern in a back metal layer coupled on a first side of a semiconductor substrate where the semiconductor substrate includes a plurality of semiconductor die. The method may include etching substantially through a thickness of the semiconductor substrate at the pattern in the back metal layer and jet ablating a layer of passivation material coupled to a second side of the semiconductor substrate to singulate the plurality of semiconductor die.

Implementations of a method of singulating a plurality of semiconductor die may include one, all, or any of the following:

The method may further include demounting the semiconductor substrate from a first tape and mounting the semiconductor substrate to a second tape.

Demounting the semiconductor substrate from the first tape may further include demounting after etching substantially through the thickness of the semiconductor substrate.

The method may further include mounting the semiconductor substrate to a first tape after etching substantially through a thickness of the semiconductor substrate.

Jet ablating the layer of passivation material may further include jet ablating from the second side of the semiconductor substrate.

Jet ablating the layer of passivation material may further include jet ablating from the first side of the semiconductor substrate.

Etching substantially through the thickness of the semiconductor substrate further includes plasma etching.

The thickness of the semiconductor substrate may be less than 50 microns.

The thickness of the semiconductor substrate may be 25 microns.

The back metal may include a thickness between 1 micron to 15 microns.

The back metal may include a thickness between 1 micron to 3 microns.

Implementations of a method of singulating a plurality of semiconductor die may include forming a pattern in a back metal layer coupled on a first side of the semiconductor substrate where the semiconductor substrate may include a plurality of semiconductor die. The method may include mounting the semiconductor substrate to a first tape and etching substantially through a thickness of the semiconductor substrate at the pattern in the back metal layer. The method may also include jet ablating a layer of passivation material coupled to a second side of the semiconductor substrate to singulate the plurality of semiconductor die.

Implementations of a method of singulating a plurality of semiconductor die may include one, all, or any of the following:

The method may further include demounting the semiconductor substrate from the first tape and mounting the semiconductor substrate to a second tape.

Demounting the semiconductor substrate from the first tape may further include demounting after etching substantially through the thickness of the semiconductor substrate.

Jet ablating the layer of passivation material may further include jet ablating from the second side of the semiconductor substrate.

Jet ablating the layer of passivation material may further include jet ablating from the first side of the semiconductor substrate.

Etching substantially through the thickness of the semiconductor substrate may further include plasma etching.

The thickness of the semiconductor substrate may be less than 50 microns.

The thickness of the semiconductor substrate may be 25 microns.

The back metal may include a thickness between 1 micron to 15 microns.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended jet ablation systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such jet ablation systems and related methods, and implementing components and methods, consistent with the intended operation and methods.

For semiconductor die that are less than 50 microns in thickness, particular processing challenges exist. Die handling, die strength, and performing processing operations with the die all present specific challenges, as die and wafer breakage can significantly reduce yield and/or affect device reliability. Die strength is negatively affected by traditional singulation options like sawing which induce die chipping and cracking along the die streets. These chips and cracks formed during the sawing process can eventually propagate during operation and reliability testing causing the die to fail.

Figure 1:
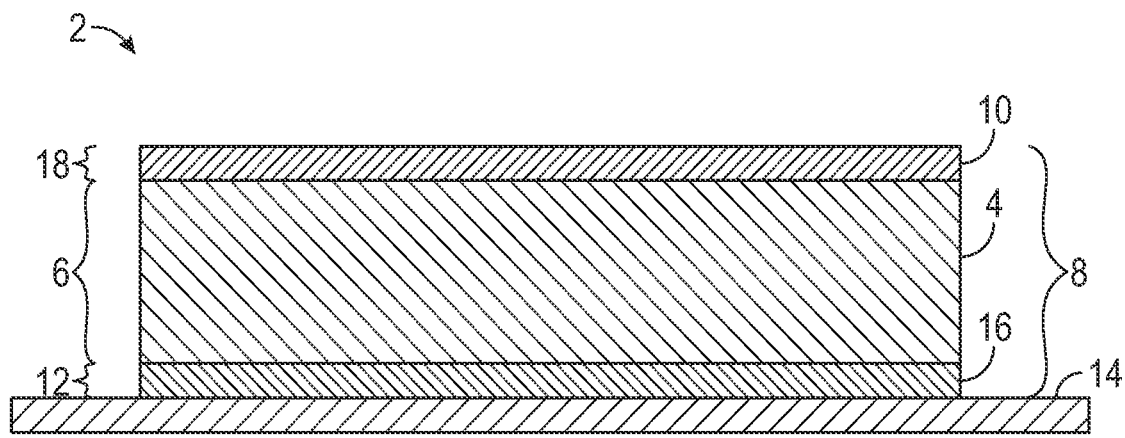
FIG. 1 is a side view of a semiconductor substrate with a passivation layer and a back metal layer thereon.

Referring to FIG. 1, in various implementations disclosed in this document, the semiconductor substrate 2 includes a plurality of semiconductor die 4 (two are subsequently illustrated in the drawings) that have been processed using a semiconductor fabrication process to form one or more semiconductor devices therein or thereon (not shown). Following the completion of the fabrication process (or during some portion of it, in some implementations), the semiconductor substrate 2 is thinned on a side of the semiconductor substrate 2 that is opposite the side on which the one or more semiconductor devices have been formed to a desired substrate thickness 6. The thinning process takes place using backgrinding, lapping, wet etching, any combination thereof, or any other technique for removing backside damage and/or the material of the semiconductor substrate 2 substantially uniformly across the largest planar surface of the substrate. The semiconductor substrate 4 may be in various implementations, by non-limiting example, single crystal silicon, polysilicon, amorphous silicon, glass, sapphire, ruby, gallium arsenide, silicon carbide, silicon-on-insulator, and any other semiconductor substrate type.

In various implementations, the thinning process may create an edge ring around the wafer (like that present in the TAIKO backgrinding process marketed by Disco Hi-Tec America, Inc. of Santa Clara, California). The edge ring acts to structurally support the wafer following thinning so that no wafer carrier may need to be utilized during subsequent processing steps. In various implementations, the thinning process may be carried out after the semiconductor substrate 2 has been mounted to a backgrinding tape whether an edge ring is formed during backgrinding or not. A wide variety of backgrinding tapes may be employed in various implementations, including those that are compatible with subsequent plasma etching operations.

Following the thinning process, the various die 4 formed in the semiconductor substrate 2 need to be singulated from one another so they can be subsequently packaged into semiconductor packages. In various implementations, following the thinning process a back metal layer 10 is applied to the semiconductor die through, by non-limiting example, sputtering, evaporation, or another metal deposition process. In various implementations, the deposition process is conducted while the wafer is either supported by an edge ring or supported by the backgrinding tape. In other implementations, however, the substrate may be demounted from the backgrinding tape and mounted to another support tape for subsequent processing steps.

FIG. 1 illustrates an implementation of a semiconductor substrate 2 following the back metal deposition process and the thinning process. In various implementations, as illustrated, the substrate 2 is coupled with a tape 14 (which may be the backgrinding or other support tape in various implementations). In other implementations, however, at this stage in the process the wafer may not be coupled with a tape 14 (such as when an edge ring is being used). As illustrated, the one or more semiconductor die 4 (not yet separately visible) are covered by a layer of passivation material 16. In various implementations the passivation material 16 may include, by non-limiting example, silicon nitride, oxides, metal electrical test structures, electrical test pads, silicon dioxide, polyimides, metal pads, residual underbump metallization (UBM), any combination thereof, and any other layer or material capable of facilitating electrical or thermal connection between the one or more semiconductor die and/or protecting the one or more semiconductor die from contaminants. Because of this, the term "passivation material" and "passivation layer," as used herein, includes any of the aforementioned materials whether the material was deposited to act as a passivating material or whether the material merely forms a non-plasma etchable portion or layer in the die street region.

As illustrated in FIG. 1, the total thickness 8 of the semiconductor substrate 2 is the additive thickness of the substrate thickness 6, the thickness 18 of the back metal 10, and the thickness 12 of the passivation material 16. In various implementations, thickness of the back metal may vary from between about 1 micron to about 15 microns. In particular implementations, the thickness of the back metal may be between about 1 micron to about 3 microns. In various implementations, the total thickness 8 of the semiconductor substrate 2 may be less than about 50 microns. In particular implementations, the total thickness 8 of the semiconductor substrate may be between about 25 microns to about 35 microns. In various implementations, the total thickness 8 may be about 25 microns.

Figure 2:
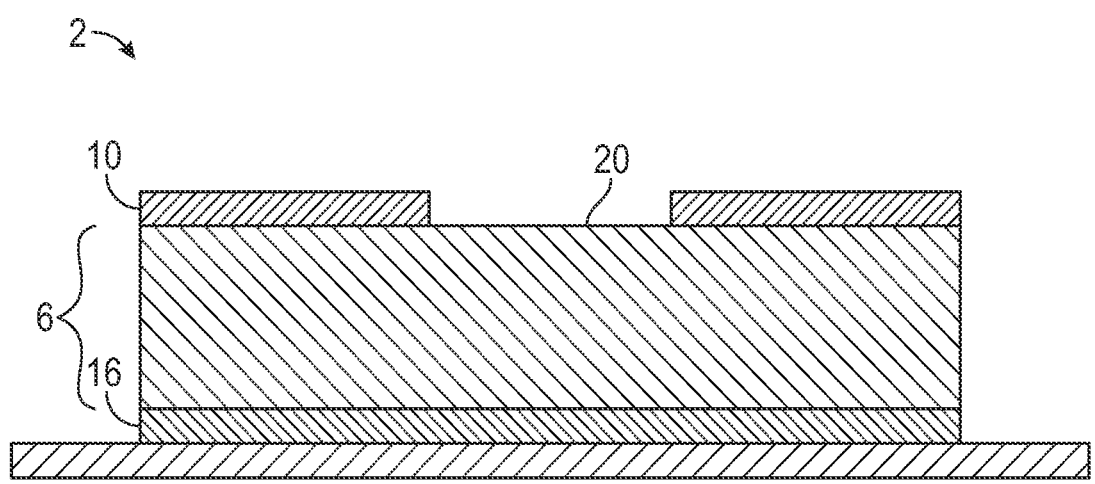
FIG. 2 is a side view of the substrate of FIG. 1 following patterning of the back metal layer.

Referring to FIG. 2, the substrate 2 is illustrated following patterning of the back metal layer 10. The patterning may be accomplished using any of a wide variety of photolithography processes involving the application of photoresist; exposure, development, then removal of the photoresist; etching of the back metal 10 using an appropriate etchant, and removal of the photoresist. With the substrate material exposed following etching and patterning of the back metal layer 10 in the patterned areas/die streets 20 of the back metal layer 10, the material of the substrate is ready for etching. In various implementations, the substrate material then be etched all the way down to or toward the passivation layer 16. In other implementations, however, the etching may be conducted partially through, or substantially through the thickness 6 of the substrate 2 down to or toward the passivation layer 16 (the etching may be carried out using a plasma etching processes in various implementations). Generally, the plasma etch chemistries used to etch the material of the substrate 2 do not etch the materials of the passivation layer or any metal structures in the street (electrical test/ alignment features, etc.), leaving the plurality of semiconductor die still unsingulated after the etching of the substrate. The semiconductor die 4 following etching of the substrate 2 are illustrated in FIG. 3.

Figure 3:
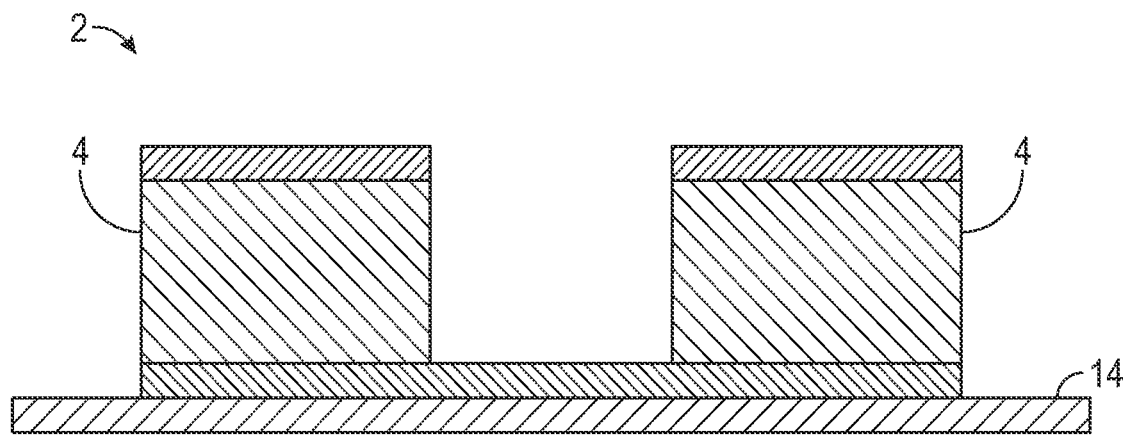
FIG. 3 is a side view of the substrate of FIG. 2 following etching of the substrate material down to the passivation layer.
Figure 4:
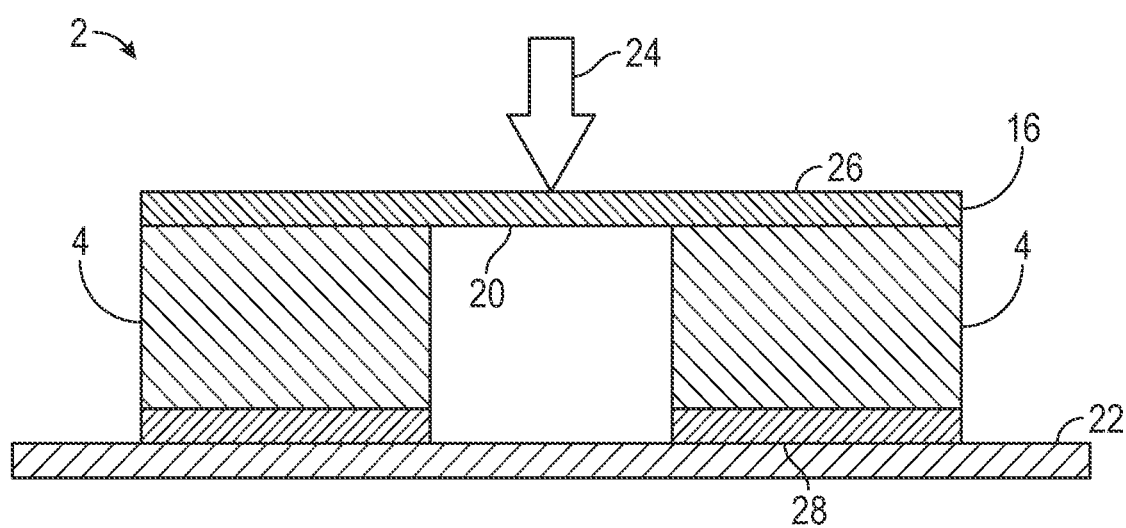
FIG. 4 is a side view of the substrate of FIG. 3 following demounting and mounting during jet ablation.

Referring to FIG. 4, the substrate 2 of FIG. 3 is illustrated after having been demounted from the original (first) tape 14 and mounted to a new tape 22 (which may be a picking tape in various implementations). As illustrated, the die 4 are still coupled together through at least the material of the passivation layer 16. In those implementations where the substrate has been only partially singulated or substantially singulated, some portion of the semiconductor material may also still couple the plurality of die together. For those implementations where an edge ring is used, the edge ring may still work to support the die 4 during the demounting and mounting process. In some implementations where an edge ring is employed and the substrate is being processed without being mounted to a backgrinding tape, the substrate may be flipped over and mounted without first being demounted following the etching step.

FIG. 4 illustrates a fluid jet 24 being applied to the location of the street 20 between the semiconductor die 40, causing the material of the passivation layer 16 (any other metal structures remaining in the street 20) to ablate away. While water may be used as being the liquid used for ablation, other fluids, gases, combinations of fluids, and combinations of fluids and gases may be employed in various method implementations.

While in various implementations and as illustrated in FIG. 4, the fluid jet 24 is applied to the passivation layer side (second side) 26 of the substrate 2 after the substrate 2 has been flipped over following etching of the substrate, in other implementations, the substrate 2 may not be flipped over and the fluid jet 24 may be applied to the street region to ablate away the material of the passivation layer from the back metal side (first side) 28 of the substrate. While the substrate 2 in FIGS. 2-4 is illustrated as having the full thickness 6 of the material of the substrate 2 etched through, in some implementations as previously discussed, a portion of the thickness of the substrate material may be left unetched to add sufficient strength to the substrate to allow it to be demounted, flipped over, and mounted. The jet ablation process may then be applied and used to remove the passivation material and the remaining material of the substrate in the street 20 as well. In some implementations, however, the substrate 2 may not be demounted and flipped over before application of jet ablation. In such implementations, it has been observed that the material of the passivation layer is driven into the tape and successfully separates the various die under the pressure of the fluid jet.

Figure 5:
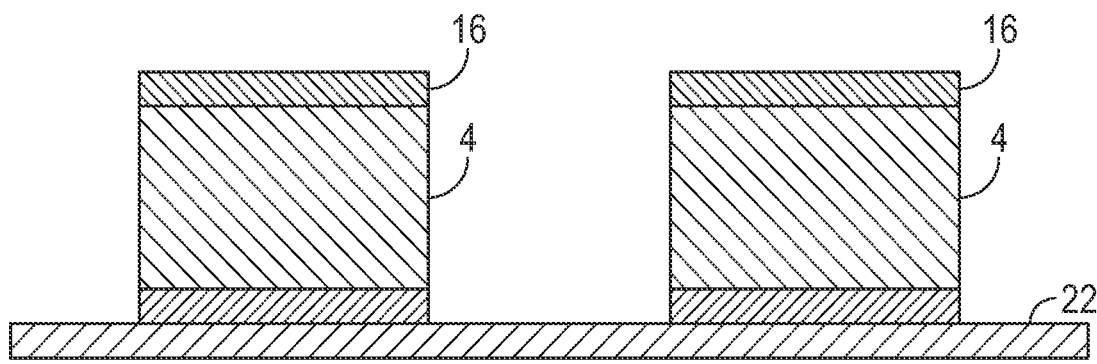
FIG. 5 is a side view of the two singulated die illustrated in FIG. 4 following ablation of the passivation layer.

Referring to FIG. 5, the semiconductor die 4 are illustrated following jet ablation of the passivation material 16. They may now be picked from the support tape 22 and prepared for subsequent packaging operations.

As illustrated in FIGS. 2 and 3, the patterned back metal is used as the patterning for the substrate etching process. Because of this, no additional photolithographic processing may be needed to carry out the substrate etching process. In some implementations, however, a photolithography step could be used to protect metal or other materials on the die during the jet ablation process. Also, because the material of the semiconductor substrate 2 works to guide the flow of the water during the water jet ablation process (i.e., through resisting the flow of fluid, the substrate material causes the passivation material to yield under the pressure of the fluid stream or focuses the energy of the fluid stream on the passivation material), no additional photolithographic steps may need to be carried out to facilitate the ablation process. This reduction in photolithographic steps reduces the number of total processing steps involving the wafer following the thinning process which can increase the overall yield of the process through reducing substrate breakage. Furthermore, because it is the jet ablation used to finish fully clearing out the street areas, no special designs (like drop out die and/or use of partial die) need to be added to the design, thereby increasing total die per wafer. Furthermore, no special street designs that include no electrical test or alignment features may need to be used to enable the plasma substrate etching process. Also, not using any saw singulating process may result in increase in good die and increases in die strength due to reductions in die chipping and cracking induced during sawing processes.

In places where the description above refers to particular implementations of jet ablation systems and related methods and implementing components, sub-components, methods and sub-methods, it should be readily apparent that a number of modifications may be made without departing from the spirit thereof and that these implementations, implementing components, sub-components, methods and sub-methods may be applied to other jet ablation systems and related methods.

What is claimed is:

1. A method of singulating a plurality of semiconductor die, the method comprising:
    etching into a first side of a semiconductor substrate, the first side opposite a second side; and
    jet ablating a layer of passivation material directly coupled to the second side of the semiconductor substrate to singulate the plurality of semiconductor die following etching into the first side of the semiconductor substrate;
    wherein the first side is a back side of the semiconductor substrate.

2. The method of claim 1, wherein the first side of the semiconductor substrate is directly coupled to a back metal layer.

3. The method of claim 1, wherein the jet ablating is done from the first side of the semiconductor substrate.

4. The method of claim 1, wherein the jet ablating is done from the second side of the semiconductor substrate.

5. The method of claim 1, wherein etching into the first side of the semiconductor substrate comprises etching entirely through a thickness of the semiconductor substrate.

6. The method of claim 1, wherein etching into the first side of the semiconductor substrate comprises etching only partially through a thickness of the semiconductor substrate.

7. The method of claim 6, further comprising jet ablating a remaining portion of semiconductor substrate in the die street with the layer of passivation material coupled to the second side of the semiconductor substrate to singulate the plurality of semiconductor die following etching into the semiconductor substrate.

8. The method of claim 1, wherein the layer of passivation material comprises a plurality of test structures.

9. A method of singulating a plurality of semiconductor die, the method comprising:
    mounting a semiconductor substrate to a first tape;
    etching into a first side of the semiconductor substrate and only partially through a thickness of the semiconductor substrate, the first side opposite a second side; and
    jet ablating a layer of passivation material directly coupled to the second side of the semiconductor substrate to singulate the plurality of semiconductor die following etching into the first side of the semiconductor substrate;

wherein the first side is a back side of the semiconductor substrate.

10. The method of claim 9, further comprising demounting the semiconductor substrate from a first tape and mounting the semiconductor substrate to a second tape.

11. The method of claim 10, wherein demounting the semiconductor substrate from the first tape further comprises demounting after etching into the semiconductor substrate.

12. The method of claim 9, further comprising mounting the semiconductor substrate to the first tape after etching into the semiconductor substrate.

13. The method of claim 9, wherein jet ablating the layer of passivation material further comprises jet ablating from the first side of the semiconductor substrate.

14. The method of claim 13, wherein the first side of the semiconductor substrate is directly coupled to a back metal layer.

15. The method of claim 9, further comprising jet ablating a remaining portion of semiconductor substrate in the die street with the layer of passivation material coupled to the second side of the semiconductor substrate to singulate the plurality of semiconductor die following etching into the semiconductor substrate.

16. The method of claim 9, wherein the layer of passivation material comprises a plurality of test structures.

17. A method of singulating a plurality of semiconductor die, the method comprising:

mounting a semiconductor substrate to a first tape;

etching into a first side of the semiconductor substrate and substantially through a thickness of the semiconductor substrate, the first side opposite a second side;

flipping the semiconductor substrate;

mounting the semiconductor substrate to a second tape;

demounting the semiconductor substrate from the first tape; and jet ablating a layer of passivation material directly coupled to the second side of the semiconductor substrate to singulate the plurality of semiconductor die following etching into the first side of the semiconductor substrate;

wherein the first side is a back side of the semiconductor substrate.

18. The method of claim 17, wherein the layer of passivation material comprises a plurality of test structures therein.

19. The method of claim 17, wherein the first side of the semiconductor substrate is directly coupled to a back metal layer.

20. The method of claim 19, wherein portions of the layer of passivation material that are jet ablated are driven into the first tape.

* * * * *